(12) United States Patent
Zhu et al.

(10) Patent No.: US 9,507,742 B2
(45) Date of Patent: Nov. 29, 2016

(54) VARIABLE LENGTH ARBITRATION

(75) Inventors: Jun Zhu, San Jose, CA (US); Joseph Jun Cao, Los Gatos, CA (US); Sheng Lu, Monte Sereno, CA (US)

(73) Assignee: Marvell World Trade Ltd., St. Michael (BB)

( * ) Notice: Subject to any disclaimer, the term of this patent is extended or adjusted under 35 U.S.C. 154(b) by 356 days.

(21) Appl. No.: 13/450,173

(22) Filed: Apr. 18, 2012

(65) Prior Publication Data

US 2012/0271976 A1    Oct. 25, 2012

Related U.S. Application Data

(60) Provisional application No. 61/477,445, filed on Apr. 20, 2011.

(51) Int. Cl.
*G06F 13/38* (2006.01)
*G06F 12/00* (2006.01)
*G06F 13/14* (2006.01)
*G06F 13/362* (2006.01)
*H03K 17/62* (2006.01)

(52) U.S. Cl.
CPC ............. *G06F 13/362* (2013.01); *G06F 12/00* (2013.01); *G06F 13/14* (2013.01); *H03K 17/62* (2013.01)

(58) Field of Classification Search
CPC ........ G06F 13/38; G06F 12/00; G06F 13/14; H03K 17/62
USPC .................. 710/243, 244; 327/407; 711/150; 718/100
See application file for complete search history.

(56) References Cited

U.S. PATENT DOCUMENTS 5,339,443 A    8/1994  Lockwood
5,815,023 A *  9/1998  Webber et al. ............... 327/407
(Continued)

FOREIGN PATENT DOCUMENTS

CN    1403913 A    3/2003
CN    1913477 A    2/2007
(Continued)

OTHER PUBLICATIONS

International Search Report and Written Opinion from the International Searching Authority dated Jun. 22, 2012 for Application No. PCT/US2012/034106; 13 pages.
(Continued)

*Primary Examiner* — Henry Tsai
*Assistant Examiner* — Christopher A Daley (57) ABSTRACT

In one embodiment, a method determines a plurality of categories for requests for a shared resource being shared by a plurality of entities. A request for the resource is received from an entity in the plurality of entities. The method determines a category in the plurality of categories for the received request. If the received request is determined to be in a first category, the method dispatches the received request to a first arbitration scheme configured to determine an arbitration decision in a first time cycle. If the received request is determined to be in a second category, the method dispatches the received request to a second arbitration scheme configured to determine an arbitration decision in a second time cycle of a different length from the first time cycle.

20 Claims, 5 Drawing Sheets

(56) References Cited

U.S. PATENT DOCUMENTS

| | | | |
|---|---|---|---|
| 7,013,357 B2* | 3/2006 | Murdock et al. | 710/240 |
| 7,120,714 B2* | 10/2006 | O'Connor | G06F 13/364 710/111 |
| 7,380,038 B2* | 5/2008 | Gray | 710/243 |
| 7,404,024 B2* | 7/2008 | Ries | G06F 13/364 710/107 |
| 7,761,529 B2 | 7/2010 | Choubal et al. | |
| 7,930,456 B1* | 4/2011 | Davis | H04L 29/06 710/107 |
| 8,024,731 B1* | 9/2011 | Cornwell et al. | 718/100 |
| 8,458,411 B2* | 6/2013 | Akaike et al. | 711/150 |
| 2002/0032819 A1* | 3/2002 | Butta | G06F 13/364 710/240 |
| 2003/0156597 A1* | 8/2003 | Eberle et al. | 370/447 |
| 2004/0103231 A1 | 5/2004 | Zhu | |
| 2005/0050283 A1* | 3/2005 | Miller et al. | 711/150 |
| 2005/0080967 A1 | 4/2005 | Ries et al. | |
| 2006/0095637 A1* | 5/2006 | Hirayama et al. | 710/309 |
| 2006/0179196 A1 | 8/2006 | Gray | |
| 2007/0073949 A1 | 3/2007 | Fredrickson et al. | |
| 2007/0174529 A1* | 7/2007 | Rodriguez et al. | 710/240 |
| 2009/0006692 A1* | 1/2009 | Blumrich et al. | 710/244 |

FOREIGN PATENT DOCUMENTS

| | | |
|---|---|---|
| CN | 101510181 A | 8/2009 |
| EP | 2015192 A1 | 1/2009 |
| JP | H09-269927 A | 10/1997 |
| JP | 2000-187639 A | 7/2000 |
| JP | 2000-339269 A | 12/2000 |
| JP | 2005-316608 A | 11/2005 |
| TW | 200907684 A | 2/2009 |

OTHER PUBLICATIONS

Extended European Search Report for European Patent Application No. 12773767.4 dated Sep. 1, 2014, 5 pages.

First Office Action dated Dec. 30, 2015 corresponding to Taiwanese Patent Application No. 101113969, 12 pages.

First Office Action dated Jul. 3, 2015 corresponding to Chinese Patent Application No. 201280019395.9, 11 pages.

Organized Translation of Notice of Reasons for Rejection dated Mar. 8, 2016 corresponding to Japanese Patent Application No. 2014-506518, 2 pages.

Second Office Action dated May 24, 2016 corresponding to Taiwanese Patent Application No. 101113969, 14 pages.

International Search Report and Written Opinion from the International Searching Authority dated Jun. 22, 2012 for Application No. PCT/US2012/034106; 12 pages.

\* cited by examiner

VARIABLE LENGTH ARBITRATION

CROSS REFERENCE TO RELATED APPLICATIONS

The present disclosure claims priority to U.S. Provisional App. No. 61/477,445 for "Variable Length Arbitration" filed Apr. 20, 2011, which is incorporated herein by reference in its entirety for all purposes.

BACKGROUND

Unless otherwise indicated herein, the approaches described in this section are not prior art to the claims in this application and are not admitted to be prior art by inclusion in this section.

Computing systems include an increased number of shared system resources, such as memory, buses, and communication interfaces. Additionally, an increased number of entities (e.g., users and clients) are sharing those resources. These different entities have different requirements on using the shared resource in the computer system. For example, some entities, like a computer processing unit (CPU), care about the access latency when fetching an instruction; and other entities, such as direct memory access (DMA) controllers, care most about throughput. An arbiter is used to manage the use of the shared resources efficiently and to best meet the requirements of different entities in the computing system.

Different arbitration algorithms, such as round robin, weighted round robin, least recently used (LRU), and most recently used (MRU), have been developed to improve the performance and fairness of the arbitration to meet different system requirements. However, as the system speed runs faster and faster, and there are more and more entities included in the arbitration, the arbiter may have trouble meeting the system design requirements. For example, if there are 64 clients that share one resource, there are 64 bits of requests. The typical arbitration cycle is fixed, such as each arbitration is performed in one clock cycle. However, when a high clock speed is used, it is difficult to achieve one cycle arbitration with even a simple round robin algorithm.

SUMMARY

In one embodiment, a method determines a plurality of categories for requests for a shared resource being shared by a plurality of entities. A request for the resource is received from an entity in the plurality of entities. The method determines a category in the plurality of categories for the received request. If the received request is determined to be in a first category, the method dispatches the received request to a first arbitration scheme configured to determine an arbitration decision in a first time cycle. If the received request is determined to be in a second category, the method dispatches the received request to a second arbitration scheme configured to determine an arbitration decision in a second time cycle of a different length from the first time cycle.

In one embodiment, the first time cycle is fixed and the second time cycle is variable.

In one embodiment, the first time cycle comprises a single clock cycle and the second time cycle comprises two or more clock cycles.

In one embodiment, if the received request is determined to be in a third category, the method evaluates a factor associated with the received request to determine if the received request should be dispatched to the first arbitration scheme or the second arbitration scheme.

In one embodiment, an apparatus includes: logic configured to receive a request for a shared resource from an entity in the plurality of entities; logic configured to determine a category in a plurality of categories for the received request, wherein the plurality of categories are for the shared resource being shared by the plurality of entities; if the received request is determined to be in a first category, logic configured to dispatch the received request to a first arbitration scheme configured to determine an arbitration decision in a first time cycle; and if the received request is determined to be in a second category, logic configured to dispatch the received request to a second arbitration scheme configured to determine an arbitration decision in a second time cycle that is in a second time cycle of a different length from the first time cycle.

In one embodiment, a system includes the shared resource and the plurality of entities sharing access to the shared resource.

The following detailed description and accompanying drawings provide a more detailed understanding of the nature and advantages of the present invention.

DETAILED DESCRIPTION

Described herein are techniques for a variable length arbitration system. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
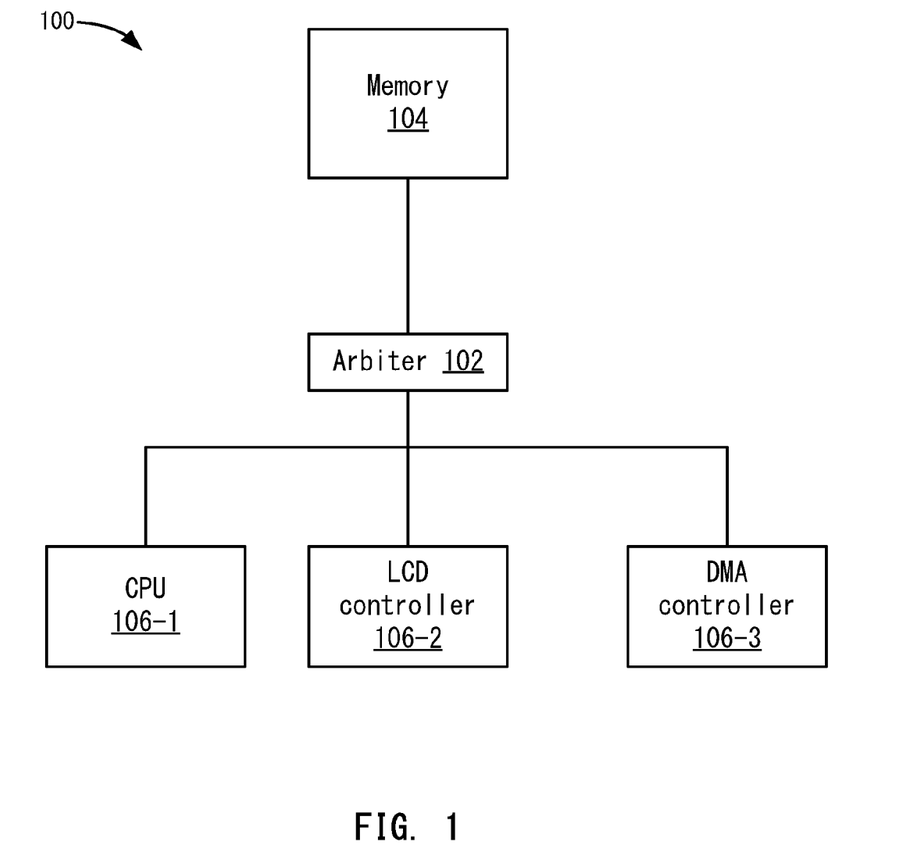
FIG. 1 depicts a simplified system for sharing resources according to one embodiment.

FIG. 1 depicts a simplified system 100 for sharing resources according to one embodiment. An arbiter 102 performs arbitration in variable clock cycles to a shared resource 104, such as memory 104. Entities 106 that are sharing the resource include a CPU 106-1, a liquid crystal display (LCD) controller 106-2, and a direct memory access (DMA) controller 106-3. Other shared resources 104 and entities 106 may be appreciated. Also, shared resource 104 will be referred to as memory 104, but other shared resources will be appreciated.

Arbiter 102 arbitrates access to memory 104 using variable length arbitration (VLA). Variable length arbitration means arbiter 102 can perform the arbitration in variable clock cycles depending on different factors, such as current status of entity requests. As will be described in more detail below, arbiter 102 may perform arbitration in two different levels (or more levels in other embodiments). In one embodiment, a first level of arbitration, "level0", and a second level of arbitration, "level1", are provided. The level0 arbitration is performed in less cycles than the level1 arbitration is performed. The level0 arbitration may be fixed or variable and the level1 arbitration is variable. For example, the level0 arbitration is performed in one cycle and the level1 arbitration is performed in variable cycles, such as one cycle or multiple cycles, e.g., two cycles (but not limited to two cycles). Thus, by offering the level0 or level1 arbitration, a variable length arbitration is offered.

Arbiter 102 may categorize requests into three categories. The first category includes entity requests that require low latency and high priority. CPU requests, such as requests for a cache line refill, are a typical example of requests that are included in the first category. In one embodiment, requests in a first category are mapped to level0 requests.

A second category includes entity requests that have variable priority and latency requirements. For example, sometimes the requirements are low and sometimes the requirements are high based on factors associated with the request. The requests in the second category may be mapped to either a level0 request or level1 request depending on a current status. Requests from LCD controller 106-2 are an example of requests that are mapped into the second category. For example, the priority of requests from LCD controller 106-2 may change based on a display buffer status, which indicates how many requests have been buffered for LCD controller 106-2.

The third category includes requests for other entities in computing system 100, such as DMA controller 106-3. These requests are mapped to level1 and are primarily not high priority or low latency.

Figure 2:
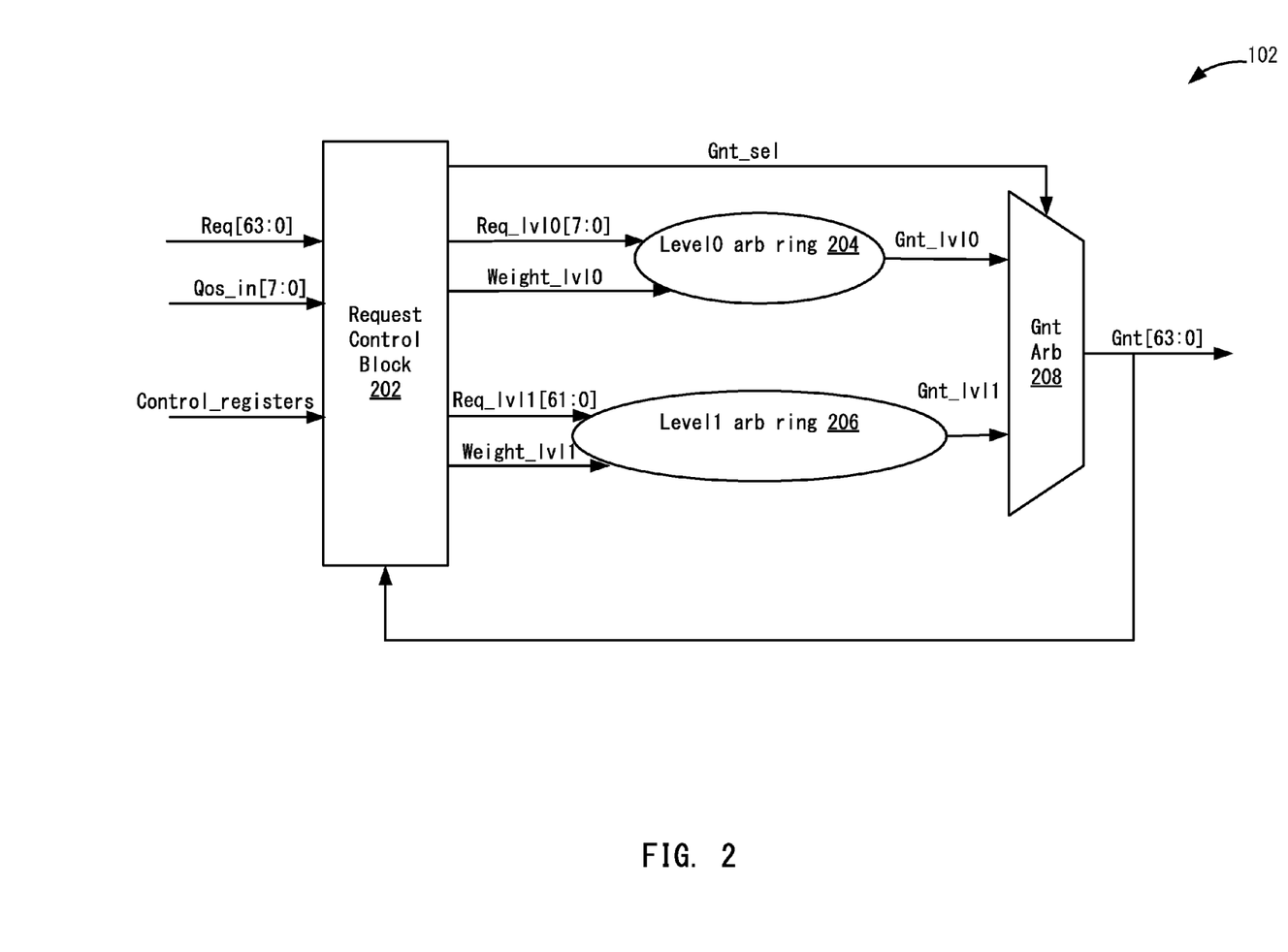
FIG. 2 depicts a simplified example of an arbiter according to one embodiment.

FIG. 2 depicts a simplified example of arbiter 102 according to one embodiment. Arbiter 102 includes a request control block 202, a level0 arbitration ring 204, a level1 arbitration ring 206, and a grant arbiter (Gnt Arb) 208.

Request control block 202 dispatches requests to level0 arbitration ring 204 and/or level1 arbitration ring 206. Request control block 202 may dispatch requests based on input criteria, such as current status and input condition. For example, request control block 202 may determine which category the request is in and dispatch the request to level0 arbitration ring 204 or level1 arbitration ring 206. For example, three categories, a category 0, category 1, and a category 2 are provided. Category 0 requests are dispatched to level0 arbitration ring 204 and category 2 requests are dispatched to level1 arbitration ring 206. Category 1 requests may be dispatched to level0 arbitration ring 204 or level1 arbitration ring 206. A QoS and/or weighting may be used for category 1 requests to determine whether those requests should be dispatched to level0 arbitration ring 204 or level1 arbitration ring 206. The QoS may be based on factors associated with the requests, such as priority and latency requirements. The status may vary for different requests from an entity 106. For example, as a conditions change at entity 106, the priority or latency requirements may be change affecting the weighting. For example, as a buffer fills up, the priority or latency requirements change for requests, such as the priority may go up.

In one embodiment, level0 arbitration ring 204 receives requests that are for a one clock cycle arbitration. For example, level0 arbitration ring 204 receives eight request inputs. Level0 arbitration ring 204 supports multiple arbitration algorithms that can be performed in one clock cycle. In one embodiment, the requests and a weighting is received and level0 arbitration ring 204 determines which request should be granted access to memory 104 based on the weighting. The weighting may be based on which requests for entities 106 have been previously granted (i.e., requests that have not been processed from an entity 106 most recently may be weighted higher).

Level1 arbitration ring 206 receives requests and uses a variable length arbitration time, such as from one to two clock cycles. The arbitration time may depend on the current status and arbitration algorithm being used. In one embodiment, level1 arbitration ring 206 receives 62 request inputs and a weighting. The weighting may be information as to which requests were previously awarded access to memory 104. Level1 arbitration ring 206 determines which request to grant access to memory 104 in two arbitrations (or more) based on the weighting.

Grant arbiter 208 decides the final grant output based on a grant selection signal gnt_sel. That is, if there is only one Arb Group of the eight Arb Groups, Arb Group00 to Arb Group 07, has active requests, select gnt_cyc1 as the gnt_lvl1 output, else select gnt_cyc2 as the gnt_lvl1 output.

Figure 3:
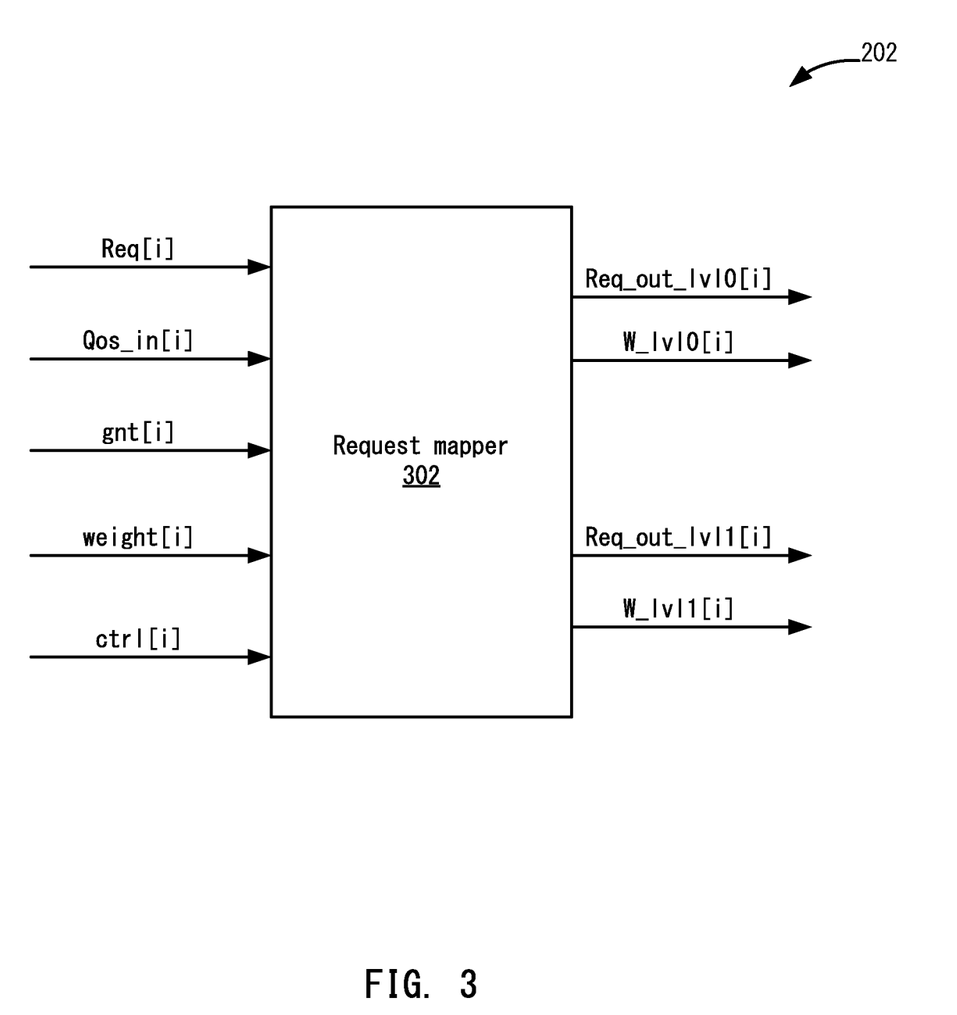
FIG. 3 depicts a more detailed example of a request control block according to one embodiment.

FIG. 3 depicts a more detailed example of request control block 202 according to one embodiment. Request control block 202 includes an n number of request mappers (req_mapper) 302.

Request mapper 302 determines if a request is a category 0 request. If so, the request is dispatched to level0 arbitration ring 204 (req_out_lvl0[i]). Additionally, a weighting W_lvl0 [i] is also sent. If request mapper 302 determines a request is a category 2 request, request mapper 302 dispatches the request to level1 arbitration ring 206 req_out_lvl1[i]. If the request is a category 1 request, request mapper 302 reviews factors related to the request, such as quality of service (QOS_in) and a weighting (weight[i]) to decide which level to be selected. The QoS may be based on a priority associated with the request. The weighting may be based on different factors, such as which requests were granted access previously. If the signal QOS_in is high, then the request is dispatched to level0 arbitration ring 204. Else, if the weighting is higher than a threshold, the request is dispatched to level0 arbitration ring 204, else the request is dispatched to level1 arbitration ring 206. The weighting may be based on previously granted requests. Request mapper 302 then updates and/or clears the weighting (W_lvl0[i] and W_lvl1 [i]) and output signals (req_out_lvl0 and req_out_lvl1) based on the current status and grant signal (gnt).

Control signal (ctrl[i]) comes from system registers. It includes control information for the requests, such as request enable, initial weight of the requests, etc.

The timing of request mapper 302 is constant, which does not impact the total complexity of computation time.

Figure 4:
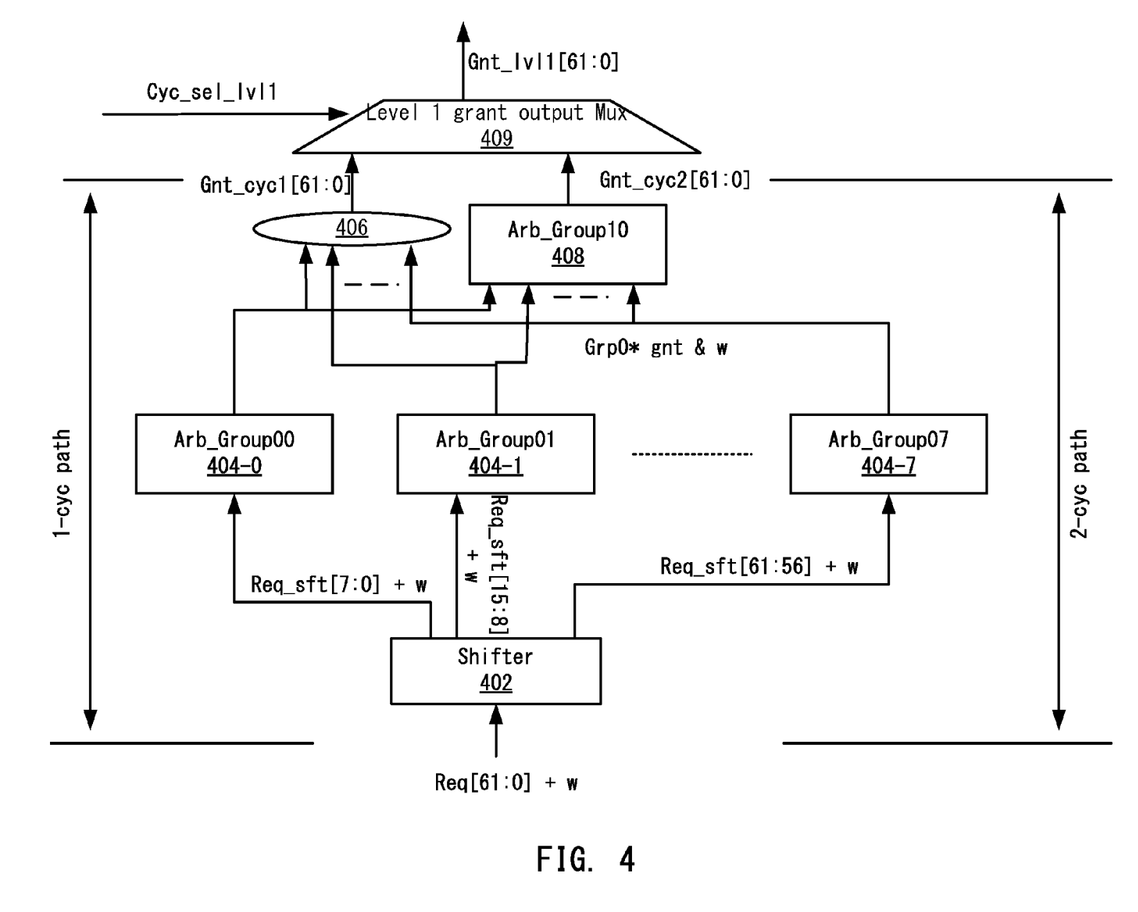
FIG. 4 depicts a more detailed example of a level1 arbitration ring according to one embodiment.

FIG. 4 depicts a more detailed example of level1 arbitration ring 206 according to one embodiment. A tree structure is provided where the level1 arbitration ring 206 is a two-layer structure. Other structures may also be appreciated. Level0 arbitration ring 204 (not shown) may be a single arbitration group 404.

A shifter 402 determines an arbitration start point that is byte-aligned. For example, shifter 402 may shift between 0-7 bits. The shift may start the arbitration at different arbitration groups 404.

Each arbitration group 404 (arb_group0*) may receive a group of requests (e.g., eight requests (req_sft[7:0]) and weighting inputs (W). Each arbitration group 404 arbitrates between the eight requests and selects one request to output.

In a level1 arbitration, one of the arbitration groups 404 is selected to arbitrate between level0 requests. In this case, other arbitration groups may not have requests to arbitrate from. In one example, arbitration group 404-0 may receive eight level0 requests and arbitrate between them. One request is selected and output through logic 406. This request is forwarded to grant arbitration logic 208. When the selection signal is received at grant arbitration logic 208, the request is output. This process takes one clock cycle.

In a level1 arbitration, arbitration groups 404 may arbitrate between eight requests using a weighting (w) and output a request that wins the arbitration. Each arbitration group 404 may output the winning request and a weighting to a second level arbitration group (arb_group10) 408. Second level arbitration group 408 performs a second arbitration with the received inputs. For example, second level arbitration group 408 receives eight request inputs and eight corresponding weighting inputs and determines a winning request that is output to grant arbitration logic 208. When the selection signal is received at grant arbitration logic 208, the winning request from arbitration group 408 is output. The level1 arbitration takes two clock cycles in this case.

Figure 5:
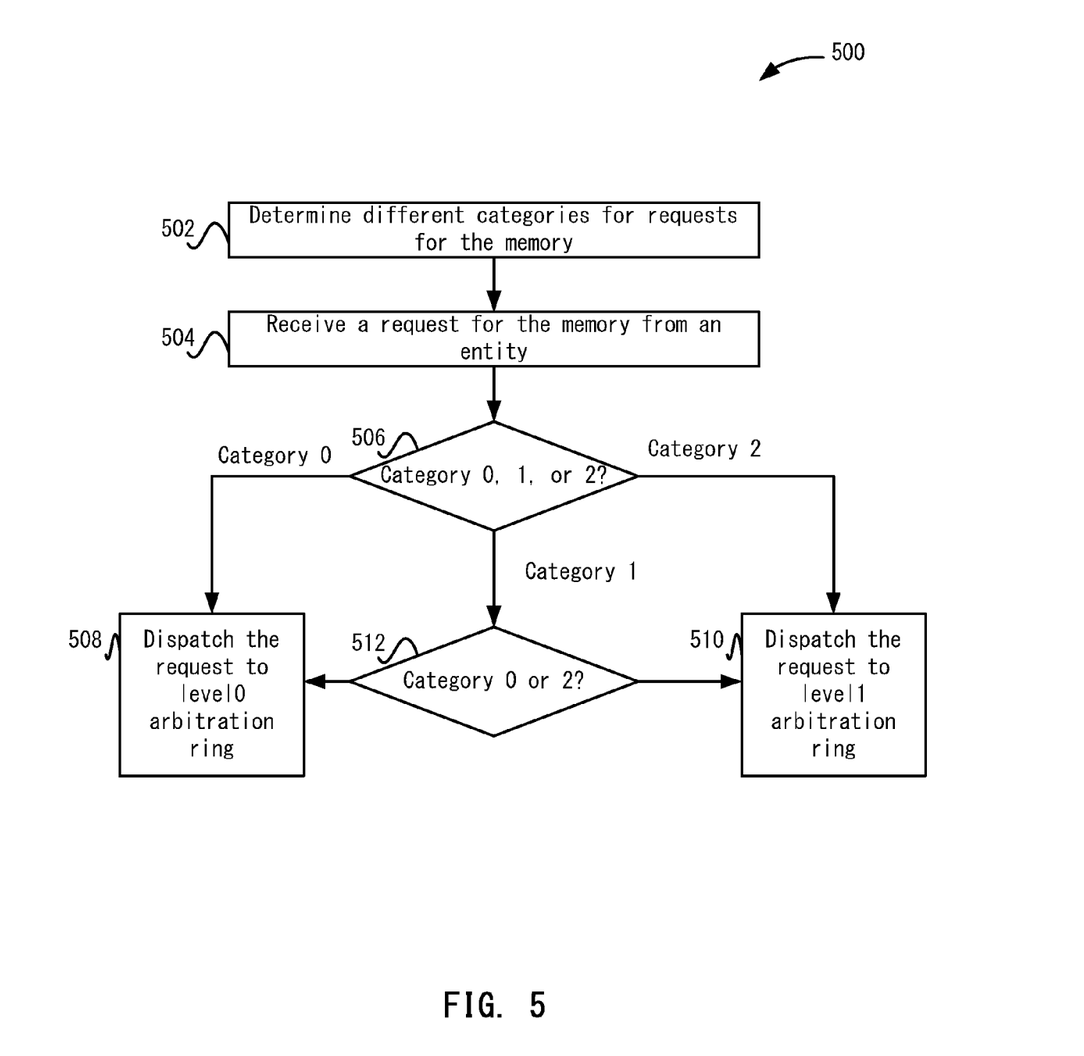
FIG. 5 depicts a simplified flowchart of a method for performing variable length arbitration according to one embodiment.

FIG. 5 depicts a simplified flowchart 500 of a method for performing variable length arbitration according to one embodiment. At 502, different categories for requests for memory 104 are determined. Memory 104 is being shared by entities 106.

At 504, arbiter 102 receives a request for memory 104 from an entity 106. At 506, arbiter 102 determines a category for the received request. For example, the request may fall within the three categories.

At 506, arbiter 102 determines if the received request is in a category 0, category 1, or a category 2. If the request is in category 0, arbiter 102 dispatches the received request to a first arbitration scheme configured to determine an arbitration decision in a first time cycle. For example, arbiter 102 dispatches the request to level0 arbitration ring 204. If the request is in category 2, arbiter 102 dispatches the request to a second arbitration scheme configured to determine an arbitration decision in a second time cycle of a different length from the first time cycle. For example, arbiter 102 dispatches the request to level1 arbitration ring 206.

If the request is in category 1, arbiter 102 determines if the request should be classified in category 0 or category 1 based on factors associated with the request. For example, arbiter 102 analyzes a QoS or weighting for the request to determine which category to classify the request. Arbiter 102 then classifies the request in category 0 or category 2.

Accordingly, a variable length arbitration is provided. Depending on the categorization of the requests, different arbitration lengths may be provided. This allows for changing arbitration length based on the priority of the request.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A method comprising:
   determining a plurality of categories for requests for a shared resource being shared by a plurality of entities;
   receiving a plurality of requests for the resource from the plurality of entities;
   determining a category in the plurality of categories for each of the plurality of requests;
   providing a first set of requests and a second set of requests from among the plurality of requests, wherein the first set of requests is determined to be in a first category and the second set of requests is determined to be in a second category;
   dispatching the first set of requests to a first arbitration scheme, wherein the first arbitration scheme implements a first arbitration algorithm configured to use a first number of clock cycles to determine a first arbitration decision, wherein the first number of clock cycles corresponds to a first amount of time used by the first arbitration scheme to determine the first arbitration decision, and wherein the first arbitration decision identifies a first request to be granted from among the first set of requests; and
   dispatching the second set of requests to a second arbitration scheme, wherein the second arbitration scheme implements a second arbitration algorithm configured to use a second number of clock cycles to determine a second arbitration decision, wherein the first number of clock cycles and the second number of clock cycles are different, wherein the second number of clock cycles corresponds to a second amount of time, different from the first amount of time, used by the second arbitration scheme to determine the second arbitration decision, and wherein the second arbitration decision identifies a second request to be granted from among the second set of requests.

2. The method of claim 1, wherein the first number of clock cycles is fixed and the second number of clock cycles is variable.

3. The method of claim 1, wherein:
   the first number of clock cycles is variable and the second number of clock cycles is variable, and
   the first number of clock cycles is less than the second number of clock cycles.

4. The method of claim 1, wherein the first number of clock cycles is less than the second number of clock cycles.

5. The method of claim 1, wherein the first arbitration scheme comprises:
   arbitrating between the first set of requests to determine the first request, wherein the first request is determined in the first number of clock cycles.

6. The method of claim 5, wherein arbitrating comprises:
   receiving the first set of requests at at least one arbiter;
   determining a sub-winner at the at least one arbiter; and
   providing the sub-winner as the first request.

7. The method of claim 1, wherein the second arbitration scheme comprises:
   arbitrating between the second set of requests to determine a plurality of sub-winner requests in a first clock cycle from among the second number of clock cycles; and
   arbitrating between the plurality of sub-winner requests to determine the second request, wherein the second request is determined in a second clock cycle from among the second number of clock cycles.

8. The method of claim 7, wherein:
arbitrating between the second set of requests comprises:
receiving portions of the second set of requests at a first level of arbiters;
arbitrating between the portion of the second set of requests to determine a sub-winner at each of the first level of arbiters; and
arbitrating between the plurality of sub-winner requests comprises:
receiving the sub-winner request from each of the first level of arbiters at a second level arbiter; and
arbitrating between the received sub-winner request to determine the second request from the determined sub-winners at the second level arbiter.

9. The method of claim 1, further comprising:
providing a third set of requests from among the plurality of requests, wherein the third set of requests are determined to be in a third category; and
evaluating a factor associated with a third request from among the third set of requests to determine if the third request should be dispatched to the first arbitration scheme or the second arbitration scheme.

10. The method of claim 9, wherein evaluating the factor comprises using a weighting or status associated with the third request to determine whether to dispatch the third request to the first arbitration scheme or the second arbitration scheme.

11. The method of claim 10, wherein the weighting comprises information relating to previously granted requests and the status is associated with a priority or latency associated with the third request.

12. An apparatus, comprising:
logic configured to receive a plurality of requests for a shared resource from a plurality of entities;
logic configured to determine a category in a plurality of categories for each of the plurality of requests, wherein the plurality of categories are for the shared resource being shared by the plurality of entities;
logic configured to provide a first set of requests and a second set of requests from among the plurality of requests, wherein the first set of requests is determined to be in a first category and the second set of requests is determined to be in a second category;
logic configured to dispatch the first set of requests to a first arbitration scheme, wherein the first arbitration scheme implements a first arbitration algorithm configured to use a first number of clock cycles to determine a first arbitration decision, wherein the first number of clock cycles corresponds to a first amount of time used by the first arbitration scheme to determine the first arbitration decision, and wherein the first arbitration decision identifies a first request to be granted from among the first set of requests; and
logic configured to dispatch the second set of requests to a second arbitration scheme, wherein the second arbitration scheme is configured to use a second number of clock cycles to determine a second arbitration decision, wherein the first number of clock cycles and the second number of clock cycles are different, wherein the second number of clock cycles corresponds to a second amount of time, different from the first amount of time, used by the second arbitration scheme to determine the second arbitration decision, and wherein the second arbitration decision identifies a second request to be granted from among the second set of requests.

13. The apparatus of claim 12, wherein the first number of clock cycles is fixed and the second number of clock cycles is variable.

14. The apparatus of claim 12, wherein:
the first number of clock cycles is variable and the second number of clock cycles is variable, and
the first number of clock cycles is less than the second number of clock cycles.

15. The apparatus of claim 13, wherein the first number of clock cycles is less than the second number of clock cycles.

16. The apparatus of claim 12, wherein the first arbitration scheme comprises:
logic configured to arbitrate between the first set of requests to determine the first request, wherein the first request is determined in the first number of clock cycles.

17. The apparatus of claim 16, wherein the logic configured to arbitrate comprises:
logic configured to receive the first set of requests at at least one arbiter;
logic configured to determine a sub-winner at the at least one arbiter; and
logic configured to provide the sub-winner as the first request.

18. The apparatus of claim 12, wherein the second arbitration scheme comprises:
logic configured to arbitrate between the second set of requests to determine a plurality of sub-winner requests in a first clock cycle from among the second number of clock cycles; and
logic configured to arbitrate between the plurality of sub-winner requests to determine the second request, wherein the second request is determined in a second clock cycle from among the second number of clock cycles.

19. The apparatus of claim 18, further comprising a first level of arbiters, wherein:
logic configured to arbitrate between the second set of requests comprises:
logic configured to receive portions of the second set of requests at the first level of arbiters;
logic configured to arbitrate between the portion of the second set of requests to determine a sub-winner at each of the first level of arbiters; and
logic configured to arbitrate between the plurality of sub-winner requests comprises:
logic configured to receive the sub-winner request from each of the first level of arbiters at a second level arbiter; and
logic configured to arbitrate between the received sub-winner request to determine the second request from the determined sub-winners at the second level arbiter.

20. A system comprising the apparatus of claim 12, further comprising:
the shared resource; and
the plurality of entities sharing access to the shared resource.

* * * * *